United States Patent
Kwok

(10) Patent No.: US 12,423,176 B2
(45) Date of Patent: Sep. 23, 2025

(54) VARIABLE NODE DATA MANAGEMENT FOR INTEGRITY CHECK IN MEMORY SYSTEMS

(71) Applicant: SK Hynix NAND Product Solutions Corp., Rancho Cordova, CA (US)

(72) Inventor: Zion Kwok, Burnaby (CA)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 161 days.

(21) Appl. No.: 18/224,030

(22) Filed: Jul. 19, 2023

(65) Prior Publication Data

US 2025/0028594 A1    Jan. 23, 2025

(51) Int. Cl.
G06F 11/10 (2006.01)
G06F 11/00 (2006.01)
H03M 13/11 (2006.01)

(52) U.S. Cl.
CPC .......... G06F 11/10 (2013.01); H03M 13/1111 (2013.01)

(58) Field of Classification Search
CPC .. G06F 11/10; G06F 11/1068; G06F 11/1012; H03M 13/1111; H03M 13/1114; H03M 13/1108; H03M 13/1171
See application file for complete search history.

(56) References Cited

U.S. PATENT DOCUMENTS

| | | | |
|---|---|---|---|
| 10,141,953 B2 | 11/2018 | Tai et al. | |
| 10,191,804 B2 | 1/2019 | Tehrani et al. | |
| 10,447,301 B2 * | 10/2019 | Hanham | H03M 13/2906 |
| 10,680,647 B2 * | 6/2020 | Bhatia | H03M 13/1117 |
| 11,115,064 B2 * | 9/2021 | Jeong | H03M 13/3707 |
| 11,309,915 B1 * | 4/2022 | Mitchell | H03M 13/616 |
| 12,169,435 B2 * | 12/2024 | Mitra | H03M 13/1111 |
| 2018/0024879 A1 | 1/2018 | Kim et al. | |
| 2019/0238158 A1 | 8/2019 | Bhatia et al. | |
| 2019/0324849 A1 | 10/2019 | Kim et al. | |
| 2021/0165712 A1 * | 6/2021 | Mitra | G06F 11/1068 |

OTHER PUBLICATIONS

SK Hynix NAND Product Solutions Corp., International Search Report and Written Opinion, PCT/US2024/038577, Oct. 30, 2024, 9 pgs.

* cited by examiner

*Primary Examiner* — Justin R Knapp
(74) *Attorney, Agent, or Firm* — Morgan, Lewis & Bockius LLP

(57) ABSTRACT

This application is directed to data validation in an electronic device. The electronic device identifies a set of check nodes associated with a variable node that corresponds to a first data bit in a block of data, and obtains check node data from each check node. A hard decision likelihood is determined based on a check node data set including the check node data of each of the set of check nodes. The electronic device dynamically determines an adjustment factor based on the hard decision likelihood. Variable node data is determined for each of the set of check nodes based on the adjustment factor. In some embodiments, each check node is configured to verify validity of a set of data bits including the first data bit, and the check node data of each of the set of check nodes indicates a likelihood of the set of data bits being erroneous.

20 Claims, 9 Drawing Sheets

VARIABLE NODE DATA MANAGEMENT FOR INTEGRITY CHECK IN MEMORY SYSTEMS

TECHNICAL FIELD

This application relates generally to memory management including, but not limited to, methods, systems, and non-transitory computer-readable media for managing variable node data during data validation in a memory system (e.g., solid-state drive).

BACKGROUND

Memory is applied in a computer system to store instructions and data. The data are processed by one or more processors of the computer system according to the instructions stored in the memory. Multiple memory units are used in different portions of the computer system to serve different functions. Specifically, the computer system includes non-volatile memory that acts as secondary memory to keep data stored thereon if the computer system is decoupled from a power source. Examples of the secondary memory include, but are not limited to, hard disk drives (HDDs) and solid-state drives (SSDs). Min-sum is a popular algorithm for identifying and/or correcting bit errors of user data that is stored in the memory with integrity data (e.g., low-density parity-check (LDPC) codes). A memory controller is applied to identify and/or correct the bit errors based on the LDPC codes. During an integrity check process, the memory controller generates variable node data for each variable node associated with a respective data bit of the user data, facilitating determining a probability of the respective data bit being erroneous. An LDPC decoder is applied based on a sum-product algorithm (SPA) involving complex mathematics of floating point numbers. However, the SPA-based decoder is slow and expensive to implement in silicon-based hardware. It would be beneficial to develop a fast and economic solution to manage the variable node data of variable nodes of the user data and enhance a tolerated raw bit error rate (RBER) of a corresponding memory system.

SUMMARY

Various embodiments of this application are directed to methods, systems, devices, non-transitory computer-readable media for adding a scaling factor, an offset, or both to manage variable node data during data validation in a memory system (e.g., solid-state drive). Low-density parity-check (LDPC) codes are used to correct bit errors. In some embodiments, a min-sum decoder is used to decode LDPC codes. The min-sum decoder operates on variable nodes that represent codeword bits and check nodes that represent parity-check equations. In various embodiments of this application, an adjustment factor s equal to at least −1 or 1 is applied during a parity check iteration to adjust variable node data (e.g., in a variable-to-check node message) sent by a variable node to a connected check node, based on one or more conditions concerning (1) whether a corresponding codeword bit is flipped, (2) whether connected check nodes of the variable node are "bad," (3) whether an intrinsic likelihood is not equal to 0, and (4) whether a hard bit read occurs or the intrinsic likelihood of a soft bit read reaches a portion of an average intrinsic likelihood. Based on adjustment of the variable node data, the tolerated RBER of a memory system (e.g., an NAND SSD) is enhanced. This is particularly valuable in PLC NAND chips, which have higher RBER than QLC or TLC NAND chips. Such a correction strength increases endurance of the NAND chips and allows the NAND chips to reach high yields earlier.

In some embodiments, check nodes are grouped into groups of check nodes (e.g., each group having 256 check nodes), and each group of check nodes corresponds to a row of circulants. During each parity check iteration, a number of unsatisfied check equations is counted in each group of check nodes. A group of check nodes is classified as "bad" if the number of unsatisfied check equations is within a predefined portion (e.g., 90%) of a maximum number of unsatisfied check equations among the groups of check nodes. In some embodiments, for a variable node, if at least a predefined number (e.g., one, two) connected check node does not belong to a "bad" group of check nodes, and if the bit is not erased and has flipped, an intrinsic likelihood (also called an input log-likelihood ratio (LLR)) for that bit is temporarily reduced by 1 to increase a difficulty level to flip. In other words, an adjustment factor s equal to −1 is applied during a corresponding parity check iteration to adjust variable node data (e.g., in a variable-to-check node message).

In one aspect, a method is implemented at an electronic device to validate data for a memory system (e.g., solid-state drives). The method includes identifying a set of check nodes associated with a variable node that corresponds to a first data bit in a block of data, obtaining check node data from each of the set of check nodes, and determining a hard decision likelihood based on a check node data set including the check node data of each of the set of check nodes. The method further includes dynamically determining an adjustment factor based on the hard decision likelihood and determining variable node data for each of the set of check nodes based on the adjustment factor.

In some embodiments, each check node is configured to verify validity of a set of data bits including the first data bit, and the check node data of each of the set of check nodes indicates a likelihood of the set of data bits being erroneous.

In some embodiments, the variable node has an intrinsic likelihood of the first data bit (e.g., indicating the first data bit being erroneous, equal to "0", or equal to "1"). The adjustment factor is determined based on the hard decision likelihood by in accordance with a determination that (1) the hard decision likelihood and the intrinsic likelihood have opposite signs, (2) each of the set of check nodes satisfies a high validity chance condition based on the check node data, and (3) the intrinsic likelihood is not equal to 0, selecting the adjustment factor between two opposite values based on a sign of the intrinsic likelihood. Further, in some situations, determining the adjustment factor based on the hard decision likelihood further includes determining that the absolute value of the intrinsic likelihood is less than a threshold intrinsic likelihood.

Some implementations of this application include an electronic device that includes one or more processors and memory having instructions stored thereon, which when executed by the one or more processors cause the processors to perform any of the above methods on a memory system (e.g., solid-state drives).

Some implementations include a non-transitory computer readable storage medium storing one or more programs. The one or more programs include instructions, which when executed by one or more processors cause the processors to implement any of the above methods on a memory system (e.g., solid-state drives).

In some embodiments, the above methods, electronic devices, or non-transitory computer readable storage medium for managing LDPC-based check node data are also used in communication (e.g., wireless communication using 5G or Wi-Fi technology, satellite communications, Ethernet communication, and communication via fiber Optic networks).

These illustrative embodiments and implementations are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

Like reference numerals refer to corresponding parts throughout the several views of the drawings.

DETAILED DESCRIPTION

Reference will now be made in detail to specific embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details. For example, it will be apparent to one of ordinary skill in the art that the subject matter presented herein can be implemented on many types of electronic devices with digital video capabilities.

Min-sum is a popular algorithm applied to correct bit errors in the LDPC codes. LDPC decoding is typically visualized as a Tanner graph with variable nodes and check nodes, and messages are exchanged between the variable and check nodes on the Tanner graph during the integrity check process. In some embodiments, an adjustment factor s equal to at least −1 or 1 is applied during a variable node update to adjust variable node data (e.g., in a variable-to-check node message) sent by a variable node to a connected check node, based on one or more conditions concerning (1) whether a corresponding codeword bit is flipped, (2) whether connected check nodes of the variable node are "bad," (3) whether an intrinsic likelihood is not equal to 0), and (4) whether a hard bit read occurs or the intrinsic likelihood of a soft bit read reaches a portion of an average intrinsic likelihood. Based on adjustment of the variable node data, the tolerated RBER of a memory system (e.g., an NAND SSD) is greatly enhanced, e.g., by up to 5%. This is particularly valuable in PLC NAND chips, which have higher RBER than QLC or TLC NAND chips. Such a correction strength increases endurance of the NAND chips and allows the NAND chips to reach high yields earlier.

Figure 1:
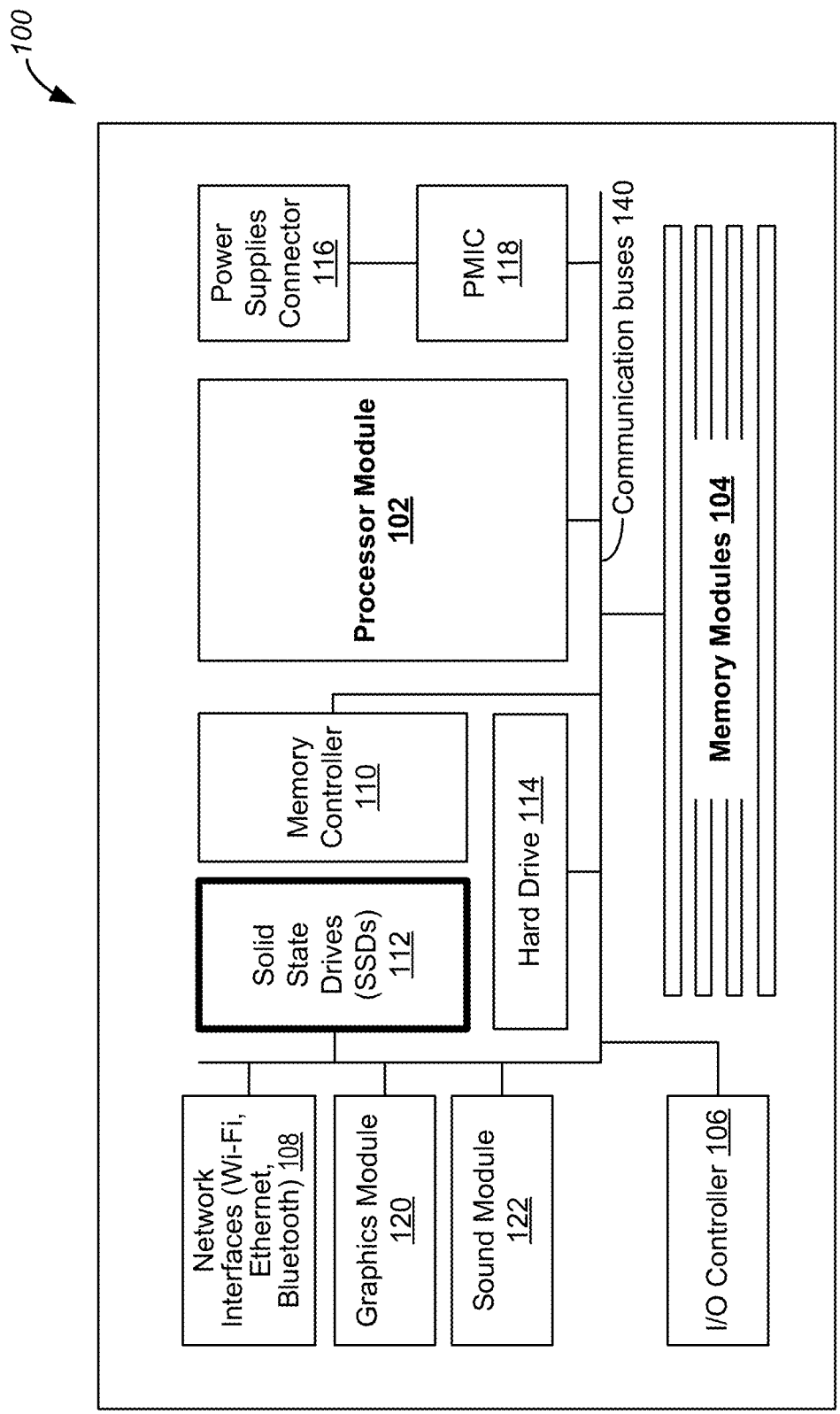
FIG. 1 is a block diagram of an example system module in a typical electronic device in accordance with some embodiments.

FIG. 1 is a block diagram of an example system module 100 in a typical electronic device in accordance with some embodiments. The system module 100 in this electronic device includes at least a processor module 102, memory modules 104 for storing programs, instructions and data, an input/output (I/O) controller 106, one or more communication interfaces such as network interfaces 108, and one or more communication buses 140 for interconnecting these components. In some embodiments, the I/O controller 106 allows the processor module 102 to communicate with an I/O device (e.g., a keyboard, a mouse or a trackpad) via a universal serial bus interface. In some embodiments, the network interfaces 108 includes one or more interfaces for Wi-Fi, Ethernet and Bluetooth networks, each allowing the electronic device to exchange data with an external source, e.g., a server or another electronic device. In some embodiments, the communication buses 140 include circuitry (sometimes called a chipset) that interconnects and controls communications among various system components included in system module 100.

In some embodiments, the memory modules 104 include high-speed random-access memory, such as static random-access memory (SRAM), double data rate (DDR) dynamic random-access memory (DRAM), or other random-access solid state memory devices. In some embodiments, the memory modules 104 include non-volatile memory, such as one or more magnetic disk storage devices, optical disk storage devices, flash memory devices, or other non-volatile solid state storage devices. In some embodiments, the memory modules 104, or alternatively the non-volatile memory device(s) within the memory modules 104, include a non-transitory computer readable storage medium. In some embodiments, memory slots are reserved on the system module 100 for receiving the memory modules 104. Once inserted into the memory slots, the memory modules 104 are integrated into the system module 100.

In some embodiments, the system module 100 further includes one or more components selected from a memory controller 110, an SSD 112, an HDD 114, power management integrated circuit (PMIC) 118, a graphics module 120, and a sound module 122. The memory controller 110 is configured to control communication between the processor module 102 and memory components, including the memory modules 104, in the electronic device. The SSD 112 is configured to apply integrated circuit assemblies to store data in the electronic device, and in many embodiments, are based on NAND or NOR memory configurations. The HDD 114 is a conventional data storage device used for storing and retrieving digital information based on electromechanical magnetic disks. The power supply connector 116 is electrically coupled to receive an external power supply. The PMIC 118 is configured to modulate the received external power supply to other desired DC voltage levels, e.g., 5V, 3.3V or 1.8V, as required by various components or circuits (e.g., the processor module 102) within the electronic device. The graphics module 120 is configured to generate a feed of output images to one or more display devices according to their desirable image/video formats. The sound module 122 is configured to facilitate the input and output of audio signals to and from the electronic device under control of computer programs.

It is noted that communication buses 140 also interconnect and control communications among various system components including components 110-122.

Further, one skilled in the art knows that other non-transitory computer readable storage media can be used, as new data storage technologies are developed for storing information in the non-transitory computer readable storage media in the memory modules 104 and in the SSD 112. These new non-transitory computer readable storage media include, but are not limited to, those manufactured from biological materials, nanowires, carbon nanotubes and individual molecules, even though the respective data storage technologies are currently under development and yet to be commercialized.

Some implementations of this application are directed to an integrity check process implemented by a memory system (e.g., SSD 112, memory module 104, HDD 114, memory controller 110), which stores codeword symbols including integrity data, e.g., LDPC codes. The integrity check process is also called a decoding process and visualized by a Tanner graph with variable nodes and check nodes. The variable nodes correspond to the codeword symbols extracted from the memory system. Each check node correspond to a distinct set of variable nodes, and has check node data configured to identify or correct bit errors in the codeword symbols corresponding to the distinct set of variable nodes. Specifically, messages are exchanged between the variable and check nodes on the Tanner graph to update the variable node data and check node data, until the bit errors are identified and corrected in the codeword symbols.

Figure 2:
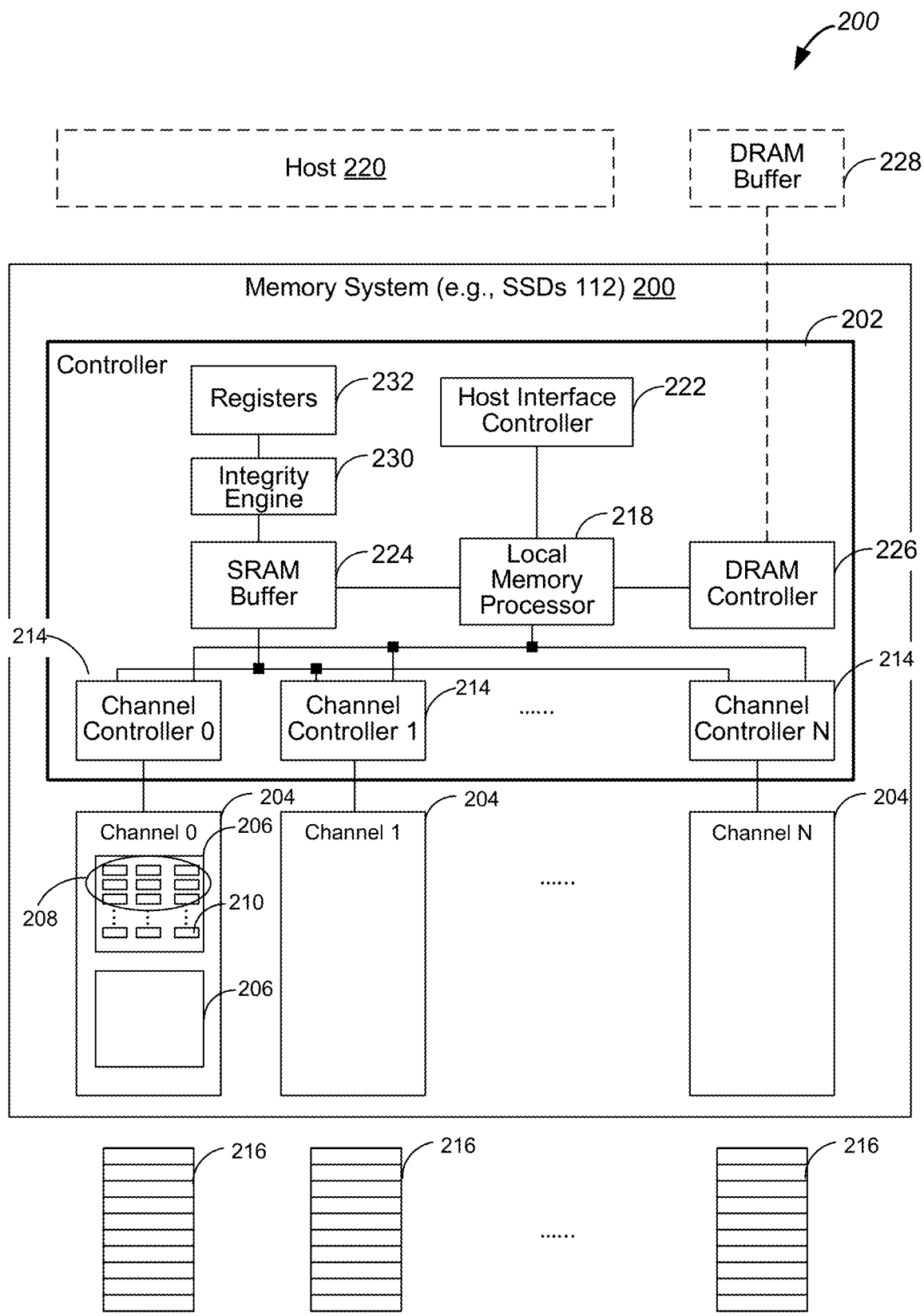
FIG. 2 is a block diagram of a memory system of an example electronic device having one or more memory access queues, in accordance with some embodiments.

FIG. 2 is a block diagram of a memory system 200 of an example electronic device having one or more memory access queues, in accordance with some embodiments. The memory system 200 is coupled to a host device 220 (e.g., a processor module 102 in FIG. 1) and configured to store instructions and data for an extended time, e.g., when the electronic device sleeps, hibernates, or is shut down. The host device 220 is configured to access the instructions and data stored in the memory system 200 and process the instructions and data to run an operating system and execute user applications. The memory system 200 further includes a controller 202 and a plurality of memory channels 204. Each memory channel 204 includes a plurality of memory cells. The controller 202 is configured to execute firmware level software to bridge the plurality of memory channels 204 to the host device 220).

Each memory channel 204 includes on one or more memory packages 206 (e.g., two memory chips, two memory dies). In an example, each memory package 206 corresponds to a memory die. Each memory package 206 includes a plurality of memory planes 208, and each memory plane 208 further includes a plurality of memory pages 210. Each memory page 210 includes an ordered set of memory cells, and each memory cell is identified by a respective physical address. In some embodiments, the memory system 200 includes a single-level cell (SLC) NAND flash memory chip, and each memory cell stores a single data bit. In some embodiments, the memory system 200 includes a multi-level cell (MLC) NAND flash memory chip, and each memory cell stores 2 data bits. In an example, each memory cell of a triple-level cell (TLC) NAND flash memory chip stores 3 data bits. In another example, each memory cell of a quad-level cell (QLC) NAND flash memory chip stores 4 data bits. In yet another example, each memory cell of a penta-level cell (PLC) NAND flash memory chip stores 5 data bits. In some embodiments, each memory cell can store any suitable number of data bits. Compared with the non-SLC NAND flash memory chips (e.g., MLC SSD, TLC SSD, QLC SSD, PLC SSD), the SSD that has SLC NAND flash memory chips operates with a higher speed, a higher reliability, and a longer lifespan, and however, has a lower device density and a higher price.

Each memory channel 204 is coupled to a respective channel controller 214 configured to control internal and external requests to access memory cells in the respective memory channel 204. In some embodiments, each memory package 206 (e.g., each memory die) corresponds to a respective queue 216 of memory access requests. In some embodiments, each memory channel 204 corresponds to a respective queue 216 of memory access requests. Further, in some embodiments, each memory channel 204 corresponds to a distinct and different queue 216 of memory access requests. In some embodiments, a subset (less than all) of the plurality of memory channels 204 corresponds to a distinct queue 216 of memory access requests. In some embodiments, all of the plurality of memory channels 204 of the memory system 200 corresponds to a single queue 216 of memory access requests. Each memory access request is optionally received internally from the memory system 200 to manage the respective memory channel 204 or externally from the host device 220 to write or read data stored in the respective channel 204. Specifically, each memory access request includes one of: a system write request that is received from the memory system 200 to write to the respective memory channel 204, a system read request that is received from the memory system 200 to read from the respective memory channel 204, a host write request that originates from the host device 220 to write to the respective memory channel 204, and a host read request that is received from the host device 220 to read from the respective memory channel 204. It is noted that system read requests (also called background read requests or non-host read requests) and system write requests are dispatched by a memory controller to implement internal memory management functions including, but are not limited to, garbage collection, wear levelling, read disturb mitigation, memory snapshot capturing, memory mirroring, caching, and memory sparing.

In some embodiments, in addition to the channel controllers 214, the controller 202 further includes a local memory processor 218, a host interface controller 222, an SRAM buffer 224, and a DRAM controller 226. The local memory processor 218 accesses the plurality of memory channels 204 based on the one or more queues 216 of memory access requests. In some embodiments, the local memory processor 218 writes into and reads from the plurality of memory channels 204 on a memory block basis. Data of one or more memory blocks are written into, or read from, the plurality of channels jointly. No data in the same memory block is written concurrently via more than one operation. Each memory block optionally corresponds to one or more memory pages. In an example, each memory block to be written or read jointly in the plurality of memory channels 204 has a size of 16 KB (e.g., one memory page). In another example, each memory block to be written or read jointly in the plurality of memory channels 204 has a size of 64 KB (e.g., four memory pages). In some embodiments, each page has 16 KB user data and 2 KB metadata. Additionally, a number of memory blocks to be accessed jointly and a size of each memory block are configurable for each of the system read, host read, system write, and host write operations.

In some embodiments, the local memory processor 218 stores data to be written into, or read from, each memory block in the plurality of memory channels 204 in an SRAM buffer 224 of the controller 202. Alternatively, in some embodiments, the local memory processor 218 stores data to be written into, or read from, each memory block in the plurality of memory channels 204 in a DRAM buffer 228 that is in memory system 200. Alternatively, in some embodiments, the local memory processor 218 stores data to be written into, or read from, each memory block in the plurality of memory channels 204 in a DRAM buffer 228 that is main memory used by the processor module 102 (FIG. 1). The local memory processor 218 of the controller 202 accesses the DRAM buffer 228 via the host interface controller 222.

Figure 3:
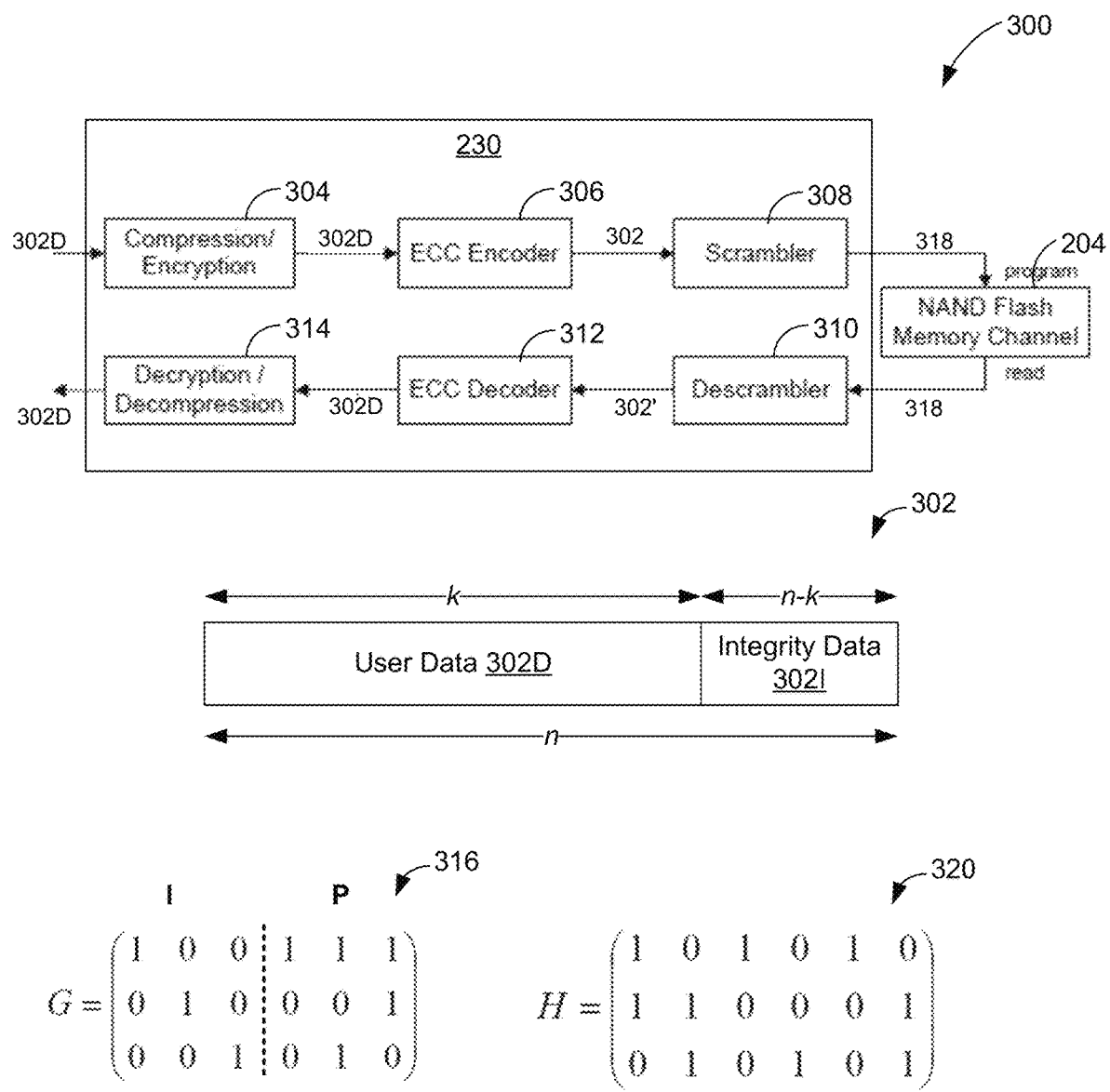
FIG. 3 is a block diagram of an example integrity check system of a memory system for processing a codeword, in accordance with some embodiments.

In some embodiments, data in the plurality of memory channels 204 is grouped into coding blocks, and each coding block is called a codeword (FIG. 3, 302). For example, each codeword includes n bits among which k bits correspond to user data and (n-k) corresponds to integrity data of the user data, where k and n are positive integers. In some embodiments, the memory system 200 includes an integrity engine 230 (e.g., an LDPC engine) and a registers 232 including a plurality of registers or SRAM cells or flip-flops and coupled to the integrity engine 230. The integrity engine 230 is coupled to the memory channels 204 via the channel controllers 214 and SRAM buffer 224. Specifically, in some embodiments, the integrity engine 230 has data path connections to the SRAM buffer 224, which is further connected to the channel controllers 214 via data paths that are controlled by the local memory processor 218. The integrity engine 230 is configured to verify data integrity for each coding block of the memory channels 204 using variable nodes and check nodes, and messages are exchanged between the variable and check nodes during the integrity check process. A subset of these messages is selected and temporarily stored in the registers 232 as variable node data or check node data.

FIG. 3 is a block diagram of an example integrity check system 300 of a memory system 200 for processing a codeword 302, in accordance with some embodiments. The integrity check system 300 includes a plurality of memory channels 204, an integrity engine 230 (e.g., an LDPC engine), and a registers 232. Data stored in memory channels 204 of the memory system 200 (FIG. 2) is grouped into coding blocks, and each coding block is called a codeword 302. Each codeword 302 further includes n data bits among which k data bits are user data 302D and (n-k) data bits are integrity data 3021 of the user data 302D, where k and n are positive integers. The integrity check system 300 is configured to verify data integrity for each codeword 302 of the memory channels 204 using variable nodes 404 and check nodes 402 (FIG. 4).

In some embodiments, the integrity engine 230) further includes one or more of: a compression module 304, an error correction code (ECC) encoder 306, a scrambler 308, a descrambler 310, an ECC decoder 312, and a decompression module 314. The compression module 304 obtains user data 302D and processes (e.g., compresses, encrypts) the user data 302D. The ECC encoder 306 obtains the user data 302D that is optionally processed by the compression module 304, and applies a parity data generation matrix G (316) on the user data 302D to encode the codeword 302. The matrix G (316) has k rows and n columns. A systematic form of the matrix G includes an identify matrix I configured to preserve the user data 302D within the codeword 302 and a parity matrix P configured to generate the integrity data 3021 from the user data 302D. In some embodiments, the matrix G (316) is not unique and includes a set of basis vectors for a vector space of valid codewords 302. The scrambler 308 obtains the codeword 302 including n data bits and converts the n data bits to a scrambled codeword 318 having a seemingly random output string of n data bits. The scrambled codeword 318 is stored in the memory channels 204 of the memory system 200.

During decoding, the scrambled codeword 318 is extracted from the memory channel 204 of the memory system 200. The descrambler 310 recovers a codeword 302" from the scrambled codeword 318, and the ECC decoder 312 verifies whether the recovered codeword 302' is valid and corrects erroneous bits in the recovered codeword 302, thereby providing the valid codeword 302 including the valid user data 302D. In some embodiments, the decompression module 314 obtains the user data 302D and processes (e.g., decompresses, decrypts) the user data 302D. In some embodiments, for integrity check, the ECC decoder 312 applies a parity-check matrix H (320) on the recovered codeword 302' to generate a syndrome vector S. The parity check matrix H (320) includes n-k rows corresponding to n-k parity check equations and n columns corresponding to n codeword bits. A relationship of the recovered codeword 302' and the syndrome vector s is represented as follows:

$$S = yH^T \qquad (1)$$

where y is the recovered codeword 302". In some embodiments, in accordance with a determination that the syndrome s is equal to 0, the ECC decoder 312 determines that all parity-check equations associated with the parity-check matrix H are satisfied and that the recovered codeword 302' is valid. Conversely, in accordance with a determination that the syndrome is not equal to 0, the ECC decoder 312 determines that at least a predefined number (e.g., one, two) parity check equation associated with the parity-check matrix H is not satisfied and that the recovered codeword 302' is not valid. Alternatively, in some embodiments, the ECC decoder 312 operates to solve the following equation:

$$S = eH^T \qquad (2)$$

where e is an error vector. The syndrome vector s is a combination of the error vector e and a valid codeword 302. Given that the syndrome vector s and the parity check matrix H are known, the ECC decoder 312 solves equation (2) to obtain the error vector e and identify the erroneous bits in the recovered codeword 302".

Figure 4A:
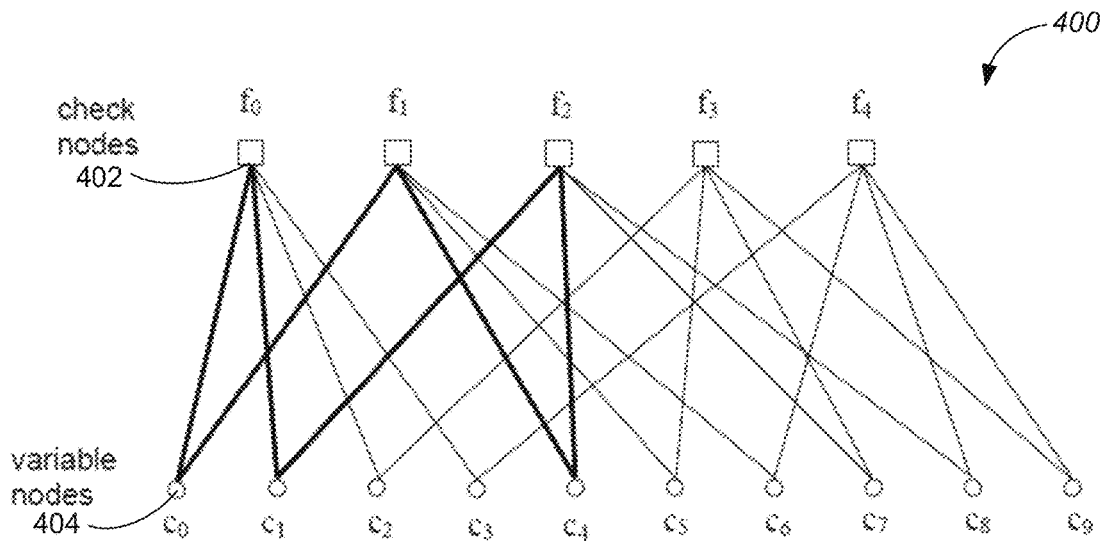
FIG. 4A is a Tanner graph applied to implement LDPC coding using check nodes and variable nodes, in accordance with some embodiments.

FIG. 4A is a Tanner graph 400 applied to implement LDPC coding using check nodes 402 and variable nodes 404, in accordance with some embodiments. Data stored in a memory system 200 (FIG. 2) is verified on a codeword basis. Each codeword 302 includes n data bits among which k data bits are user data 302D and n-k data bits are integrity data 302I of the user data 302D, where k and n are positive integers. In some embodiments, the parity check matrix H (320) is applied without differentiating the user data 302D and the integrity data 302I during integrity check. The parity-check matrix H (320) includes n-k rows corresponding to n-k parity-check equations and n columns corresponding to n codeword bits, where k and n are positive integers. Each parity-check equation combines corresponding n codeword bits (also called codeword symbols), and therefore, corresponds to a check node 402 that is connected up to a subset or all of the n variable nodes 404. In some embodiments, only j codeword bits in the n codeword bits correspond to 1 in the parity check matrix H (320) for a row corresponding to check node 402, where j is an integer less than n, and the check node 402 is connected to the j variable nodes 404. In some embodiments, each and every check node 402 is connected to the same number of variable nodes 404 (e.g. j variable nodes 404). Alternatively, in some embodiments, each check node 402 is connected to a respective number of variable nodes 404, and at least two check nodes 402 are connected to different numbers of variable nodes 404.

Referring to FIG. 4A, in this example, the codeword 302 has 10 codeword symbols (also called codeword bits). Five parity check equations are applied to do integrity check on the codeword 302, and each parity check equation is applied on a set of four codeword symbols (j=4). As such, the Tanner graph 400 includes five check nodes 402 ($f_0$-$f_4$) and each check node 402 is connected to four respective variable nodes 404 each corresponding to a distinct set of four codeword symbols of the codeword 302.

In some embodiments, the ECC decoder 312 solves equation (2) to obtain the error vector e and identify one or more erroneous bits in the codeword 302 by an iterative integrity check process. Messages are exchanged between the variable nodes 404 and check nodes 402 on the Tanner graph 400 until the one or more erroneous bits are identified or corrected in the codeword 302. Each variable node 404 is assigned with initial variable node data. In some embodiments, the initial variable node data includes a log-likelihood ratio (LLR) that is determined based on data measured when a read reference voltage is adjusted for the memory system 200. Each check node 402 is connected to a set of variable nodes 404, and receives messages including the initial variable node data from the set of variable nodes 404. For each check node 402, the check node data is determined based on the initial variable node data of the set of variable nodes 404, and indicates a likelihood of a set of codeword symbols corresponding to the set of variable nodes 404 being erroneous. Conversely, each variable node 404 is also connected to a set of check nodes 402 on the Tanner graph 400, and receives messages including the check node data from the set of check nodes 402. For each variable node 404, variable node data is updated based on the check node data 422 of the set of check nodes 404. By these means, the messages are exchanged between the check nodes 402 and variable nodes 404 until an integrity check requirement is satisfied, and the one or more erroneous bits are identified or corrected based on the variable node data or the check node data. In some embodiments, the integrity check requirement is satisfied when sign 424 is 0 for all check nodes 402.

Figure 4B:
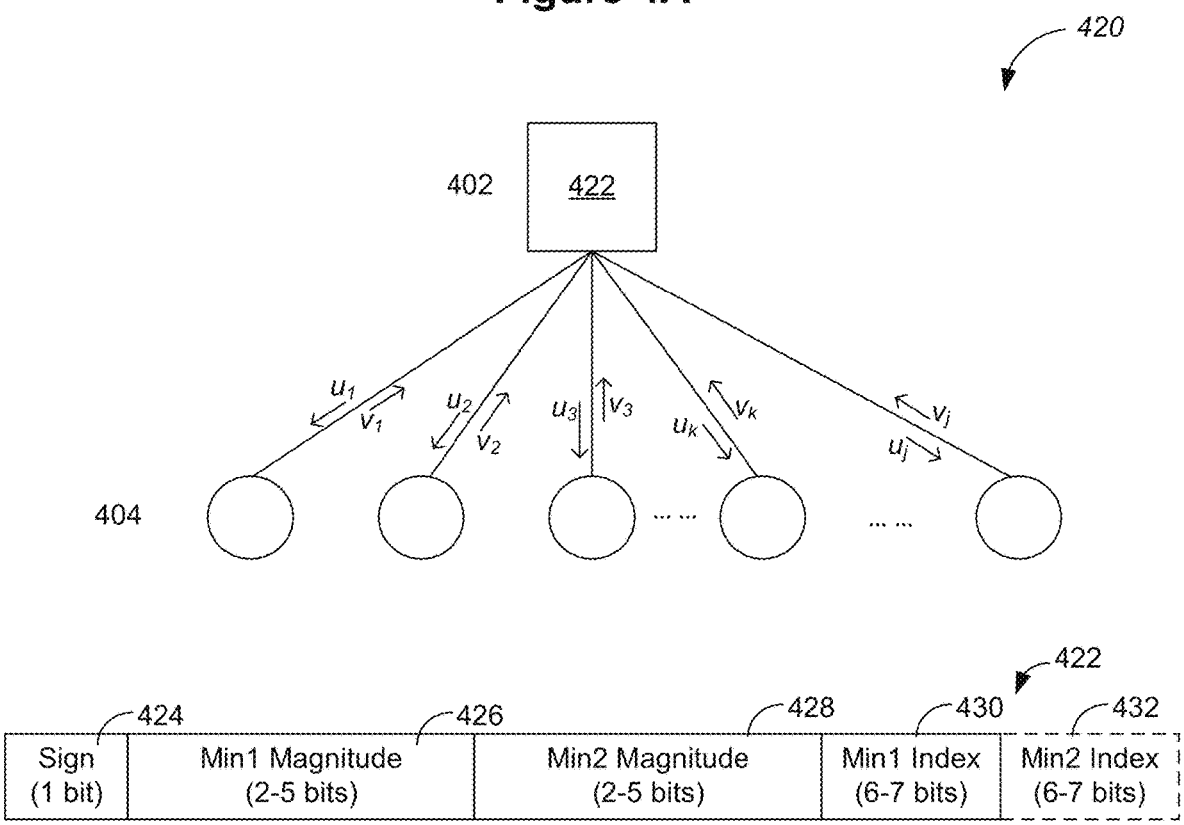
FIG. 4B is a simplified Tanner graph having a single check node coupled to a set of variable nodes, in accordance with some embodiments.

FIG. 4B is a simplified Tanner graph 420 having a single check node 402 coupled to a set of variable nodes 404, in accordance with some embodiments. Check node 402 receives variable-to-check node message data $v_1$, $v_2$, $v_3$, ... $v_j$ from j variable nodes 404, where j is also known as the degree of the check node, $d_c$. After a check node update is performed based on a min-sum algorithm, check node 402 sends check-to-variable node message data $u_1$, $u_2$, $u_3$, ... $u_j$ to $d_c$ variable nodes 404. Details about the check node update calculation for k, where k is an integer in the range [1, $d_c$], are as follows:

$$u_k = \left( \prod_{m=1, m \neq k}^{d_c} \text{sign}(v_m) \right) \times \min_{m \neq k} |v_m| \quad (3)$$

$$\text{sign}(u_k) = \left( \prod_{m=1, m \neq k}^{d_c} \text{sign}(v_m) \right) \quad (4)$$

$$|u_k| = \min_{m \neq k} |v_m| = \begin{cases} \text{Min2 Magnitude}, & k = \text{Min1 Index} \\ \text{Min1 Magnitude}, & k \neq \text{Min1 Index} \end{cases} \quad (5)$$

where Min1 and Min2 correspond to two variable nodes 404 having the most minimum variable-to-check node message magnitude and the second minimum variable-to-check node message magnitude, respectively. The check node data 422 includes a sign bit 424, a first likelihood data item 426 (Min1 Magnitude), a second likelihood data item 428 (Min2 Magnitude), and a first index data item 430 (Min1 Index). In accordance with equation (4), the sign bit 424 is generated based on signs of the variable-check node message data ($v_1$-$v_m$) from the set of variable nodes 404. Stated another way, the sign bit 424 is a combination of signs of respective likelihood data items of a subset of codeword symbols corresponding to the set of variable nodes 404. The first likelihood data item 426 and the second likelihood data item 428 include magnitudes of the most minimum variable-to-check node message data (Min1) and the second minimum variable-to-check node message data (Min2) of the set of variable nodes 404, respectively. The first index data item 430 identifies one of the set of variable nodes 404 corresponding to the first likelihood data item 426. In some embodiments, the check node data 422 further includes a second index data item 432 identifying a second one of the set of variable nodes 404 corresponding to the second likelihood data item 428.

Figure 4C:
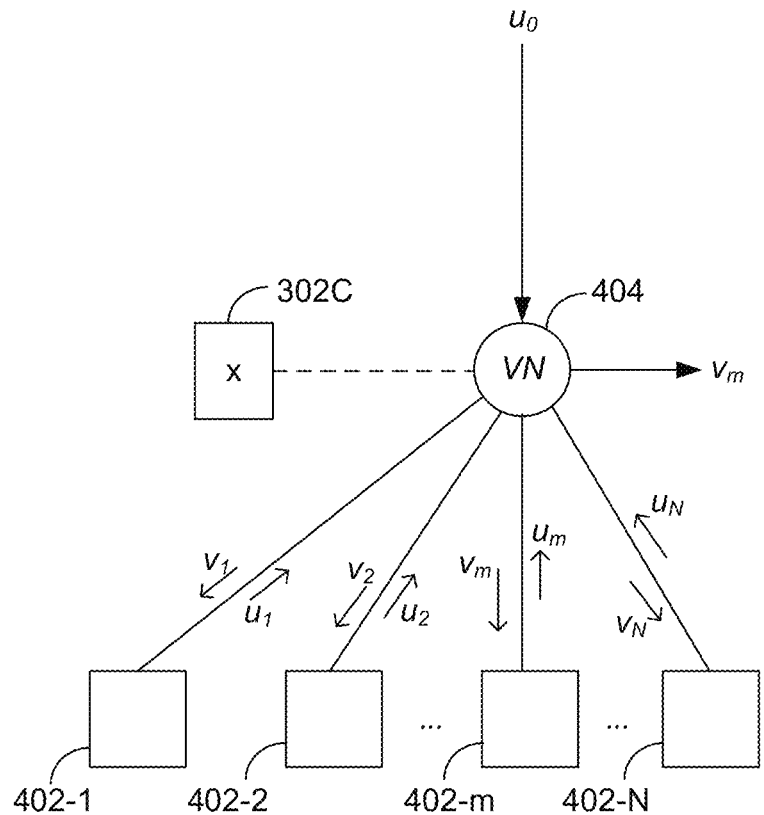
FIG. 4C is another simplified Tanner graph having a single variable node coupled to a set of check nodes, in accordance with some embodiments.

FIG. 4C is another simplified Tanner graph 420 having a single variable node 404 coupled to a set of check nodes 402, in accordance with some embodiments. Each single variable node 404 corresponds to a first data bit 302C (e.g., $c_0$, $c_1$, ..., $c_9$ in FIG. 4A) of the codeword 302. Data bit is also called codeword symbol. The variable node 404 receives check-to-variable node message data $u_1$, $u_2$, $u_3$, ... $U_N$ (also called check node data) from N check nodes 402, where N is also known as a degree of the variable node 404. When a variable node update is performed based on a min-sum algorithm, each of the N check nodes 402 sends check-to-variable node message data $u_1$, $u_2$, $u_3$, ... $u_N$ to the same variable node 404. Variable-to-check node message data $v_m$ (also called variable node data) is further generated based on the check-to-variable node message data $u_1$-$u_N$, and sent from the variable node 404 to an m-th check node 402-m of the set of check nodes 402, where m is an integer in the range [1, N]. The variable-to-check node message data $v_m$ is represented as follows:

$$v_m = u_0 + \sum_{k=1, k \neq m}^{d_v} u_k \qquad (6)$$

where $u_0$ is an intrinsic likelihood of the first data bit 302C in an example. In another example, $u_0$ is an intrinsic likelihood of the first data bit 302C being a logic bit 1. In yet another example, $u_0$ is an intrinsic likelihood of the first data bit 302C being erroneous. In some embodiments, a scaling factor g is used to multiply a sum of check-to-variable node message data, and the sum and an intrinsic likelihood $u_0$ (also called input LLR) in the variable node update are combined to generate the variable-to-check node message data $v_m$ as follows:

$$v_m = u_0 + g \sum_{k=1, k \neq m}^{N} u_k \qquad (7)$$

where g is the scaling factor. A hard decision likelihood $v_0$ of this variable node 404 is represented as:

$$v_0 = u_0 + g \sum_{k=1}^{N} u_k \qquad (8)$$

In some embodiments, a sticky adjustment, s, is added to equation (7) as follows:

$$v_m = u_0 + g \sum_{k=1, k \neq m}^{N} u_k + s \qquad (9)$$

where in some embodiments, the adjustment factor s is equal to −1, 0, or +1. In an example, the adjustment factor s is applied (i.e., s is not equal to 0), when the input LLR data item $u_0$ is not equal to 0 and when a sign of the hard decision likelihood $v_0$ is different from a sign of the intrinsic likelihood $u_0$. Otherwise, the adjustment factor s is equal to 0. When the signs of the hard decision likelihood $v_0$ and the intrinsic likelihood $u_0$ are opposite, the first data bit 302C corresponding to the variable node 404 is flipped, e.g., from "1" to "0" or from "0" to "1."

Alternatively, in another example, the adjustment factor s is applied (i.e., s is not equal to 0), when the intrinsic likelihood $u_0$ is not equal to 0, when the signs of the hard decision likelihood $v_0$ and the intrinsic likelihood $u_0$ are opposite, and when a column of circulants 806 (FIG. 8) including the variable node 404 is "not bad." Otherwise, if any of these conditions fails, the adjustment factor s is equal to 0. More details on determining whether the column of circulants is "not bad" are explained below with reference to FIG. 8. For example, the adjustment factor s is determined using the following conditions:

```
if ((column is "not bad") and (input LLR ≠ 0) and (bit is flipped))
    s = (input LLR > 0) ? −1 : 1
else
    s = 0
```

Additionally, in some embodiments, each variable node $v_m$ corresponds to a respective intrinsic likelihood $u_0$, and an average intrinsic likelihood is an average of all data bits in a block of data of the codeword 302. In some embodiments, the intrinsic likelihood $u_0$ of the variable node 404 is less than a predefined portion (e.g., ½) of the average intrinsic likelihood, indicating a relatively low confidence of determining the data bit 302C (e.g., being a logical bit 0, logical bit 1, or erroneous). The adjustment factor s is applied (i.e., not equal to 0) to adjust the intrinsic likelihood $u_0$ for the variable-to-check node message data $v_m$ of the variable node 404. Alternatively, in some embodiments, for a hard bit read (HBR), the intrinsic likelihood $u_0$ of each data bit of the codeword 302 optionally has an absolute value with a positive or negative sign or is equal to zero. In accordance with a determination that the intrinsic likelihood $u_0$ is not equal to zero, the adjustment factor s is applied (i.e., not equal to 0) to adjust the intrinsic likelihood $u_0$ for the variable-to-check node message data $v_m$ of the variable node 404. For example, the adjustment factor s is determined using the following conditions:

```
if ((column is "not bad") and (input LLR ≠ 0) and (bit is flipped) and
(HBR or (|input LLR| < 0.5 * average input LLR)))
    s = (input LLR > 0) ? −1 : 1
else
    s = 0
```

Further, in some embodiments, when the adjustment factor s is applied (i.e., not equal to 0), a sign of the adjustment factor s is determined based on the sign of the intrinsic likelihood $u_0$ of the variable node 404. For example, the sign of the adjustment factor s is opposite to the sign of the intrinsic likelihood $u_0$ of the variable node 404. Stated another way, in accordance with a determination that the intrinsic likelihood $u_0$ is greater than 0, the adjustment factor s is equal to −1. In accordance with a determination that the intrinsic likelihood $u_0$ is not greater than 0 (i.e., equal to or less than 0), the adjustment factor s is equal to 1.

Figure 5A:
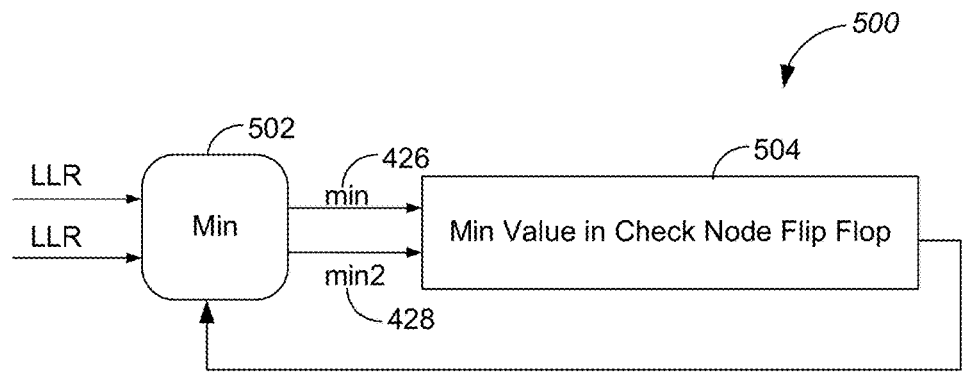
FIG. 5A is a schematic diagram of a sequence of check node operations implemented to determine check node data of a check node during LDPC decoding, in accordance with some embodiments.

FIG. 5A is a schematic diagram of a sequence of check node operations 500 implemented to determine check node data of a check node 402 during LDPC decoding, in accordance with some embodiments. LDPC decoding is performed based on a min-sum method. An integrity engine 230 (FIG. 2) organizes a plurality of arithmetic units and a registers 232 to implement an instruction corresponding to the min-sum method without frequently interacting with a local memory processor 218. Specifically, each check node 402 corresponds to a parity-check equation that combines corresponding n codeword symbols (also called codeword bits), and is connected to a subset of the n variable nodes 404. In some embodiments, only j codeword symbols in the n codeword symbols are associated with non-zero coefficients in the parity-check equation, and the check node 402 is connected to the j variable nodes 404. For each check node 402, the plurality of arithmetic units includes a comparator operator 502 coupled to flip-flops 504 in a registers 232 (FIG. 2). The comparator operator 502 receives variable-to-check node message data from a subset of the j variable nodes 404 connected to the check node 402, and check node data 422, and determines the first likelihood data item 426 and the second likelihood data item 428, corresponding to the most minimum variable-to-check node message data (Min1) and the second minimum variable-to-check node message data (Min2) of the set of/variable nodes 404, respectively. The first likelihood data item 426 and the second likelihood data item 428 are stored into the flip flops 504 of the registers 232. In some embodiments, the variable-to-check node message data from each of the set of/variable nodes 404 includes an LLR that is determined based on data measured when a read reference voltage is adjusted for the memory system 200.

Figure 5B:
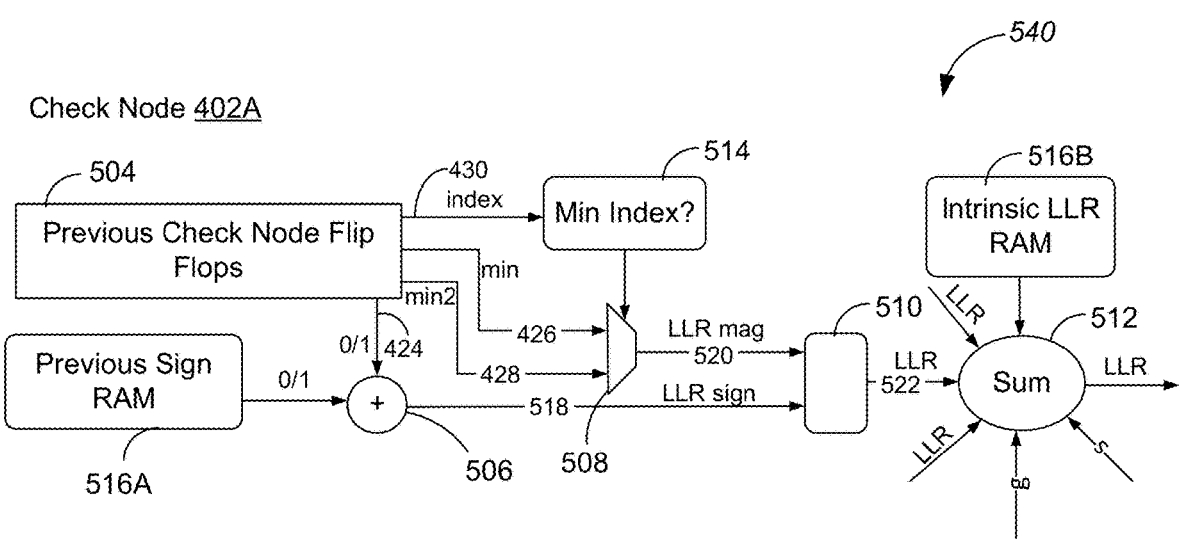
FIG. 5B is a schematic diagram of a sequence of variable node operations implemented to determine variable node data of a variable node during LDPC decoding, in accordance with some embodiments.

FIG. 5B is a schematic diagram of a sequence of check node and variable node operations 540) implemented to determine variable-to-check node message data $v_m$ from a variable node 404 during LDPC decoding, in accordance with some embodiments. For each variable node 404, the plurality of arithmetic units organized by the integrity engine 230 includes a sign operator 506, a multiplexer 508, a combiner 510, a sum operator 512, an index identifier 514, and one or more random access memory (RAM) 516. The RAM 516 stores data involved in the check node and variable node operations 540 temporarily. In some embodiments, the registers 232 further includes the RAM 516 associated with these check node and variable node operations 540. Each variable node 404 is connected to a set of check nodes 402, and applied in a set of parity-check equations corresponding to the set of check nodes 402. One of the set of check nodes 402 corresponds to check node data stored in the flip-flops 504 and including a sign bit 424, a first likelihood data item 426, a second likelihood data item 428, and a first index data item 430. A previous variable-to-check node message data sign stored in a RAM 516A is combined with the sign bit 424 by the sign operator 506 to form an LLR sign 518. The index identifier 514 compares an index k of the variable node 404, which uniquely identifies one variable node 404 among the j variable nodes connected to one check node 402, with the first index data item 430. In accordance with a comparison result, the multiplexer 508 selects one of the likelihood data items 426 and 428 as a likelihood data item 520, and the combiner 510 generates a signed LLR data item 522 that is sent from check node 402 to variable node 404 based on the LLR sign 518 and likelihood data item 520 (e.g., a value of $u_k$ in equations (6)-(9)). Specifically, in some embodiments, in accordance with a determination that the index k of the variable node 404 is equal to the first index data item 430, the multiplexer 508 selects the second likelihood data item 428 as the likelihood data item 520 (e.g., a value of $u_k$ in equations (6)-(9)). Conversely, in some embodiments, in accordance with a determination that the index k of the variable node 404 is not equal to the first index data item 430, the multiplexer 508 selects the first likelihood data item 426 as the likelihood data item 520.

In some embodiments, intrinsic LLR data (e.g., intrinsic likelihood $u_0$) corresponds to initial variable node data of each variable node 404 associated with a respective codeword symbol of a codeword 302. The intrinsic LLR data is determined based on a log-likelihood ratio (LLR) that is approximated as follows:

$$LLR(y) = \ln \frac{p(x=0|y)}{p(x=1|y)} = \ln \frac{p(y|x=0)}{p(y|x=1)} \quad (10)$$

where p(|) is a probability of a combination of data values, x is a value stored for the respective codeword symbol, and y is a correct value of the respective codeword symbol. The intrinsic LLR data is determined based on data measured when a read reference voltage is adjusted for the memory system 200.

The sum operator 512 combines intrinsic LLR data stored in the RAM 516B. LLR data items 522 (e.g., $u_k$ in equations (6)-(9)), scaling factor g, and adjustment factor s for the set of check nodes 402 to update the variable node data (e.g., variable-to-check node message data $v_m$) associated with the variable node 404.

Figure 6:
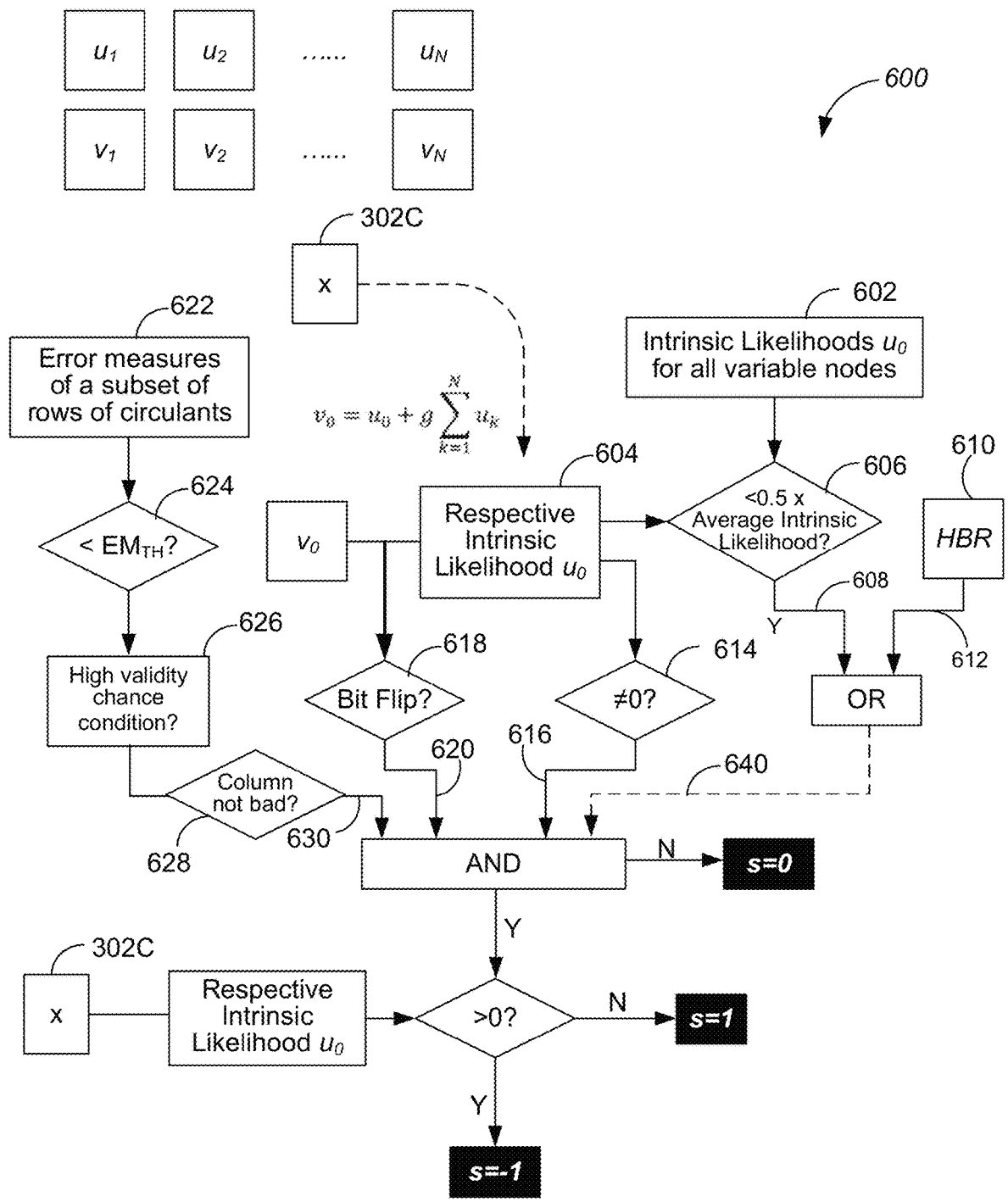
FIG. 6 is a flow diagram of an example process for determining an adjustment factor for variable node data of a variable node, in accordance with some embodiments.

FIG. 6 is a flow diagram of an example process 600 for determining an adjustment factor s for variable node data $v_m$ of a variable node 404, in accordance with some embodiments. A variable-to-check node message includes the variable node data, and is sent from the variable node 404 to a connected check node 402. Data stored in memory channels 204 of the memory system 200 (FIG. 2) is grouped into coding blocks, and each coding block of data bits is called a codeword 302. Each codeword 302 further includes n data bits among which k data bits are user data 302D and (n-k) data bits are integrity data 302I of the user data 302D, where k and n are positive integers. Each parity-check equation combines corresponding n codeword bits (also called codeword symbols), and therefore, corresponds to a check node 402 that is connected up to a subset or all of the n variable nodes 404. Each variable node 404 is also connected to a set of check nodes 402 (e.g., N check nodes 402) on the Tanner graph 400, and receives messages including the check node data from the set of check nodes 402.

For each variable node 404, a respective intrinsic likelihood $u_0$ is determined (operation 602), and includes (operation 604) an intrinsic likelihood $u_0$ of a variable node 404 corresponding to a first data bit 302C. In an example, the intrinsic likelihood $u_0$ indicates that the first data bit 302C being erroneous. In another example, the intrinsic likelihood $u_0$ indicates that the first data bit 302C being equal to "0". In yet another example, the intrinsic likelihood $u_0$ indicates that the first data bit 302C being equal to "1".

An average intrinsic likelihood is an average of the absolute value of the intrinsic likelihood of all data bits in the block of data of the codeword 302. The intrinsic likelihood $u_0$ corresponding to the first data bit 302C is compared (operation 606) with than a predefined portion (e.g., ½) of the average intrinsic likelihood, thereby determining a confidence level of determining the first data bit 302C (e.g., being a logical bit 0, a logical bit 1, or erroneous). In some situations, the intrinsic likelihood $u_0$ corresponding to the first data bit 302C is less than (condition 608) the predefined portion of the average intrinsic likelihood. In some situations, a hard bit read is detected (operation 610). An intrinsic likelihood $u_0$ of a data bit of the codeword 302 optionally has an absolute value with a positive or negative sign or is equal to zero. Further, in some situations, the intrinsic likelihood $u_0$ is determined (condition 612) to be not equal to zero. Condition 640 is satisfied if condition 608, condition 612, or both are satisfied.

The intrinsic likelihood $u_0$ corresponding to the first data bit 302C is compared (operation 614) with 0. In some situations, the first intrinsic likelihood $u_{01}$ corresponding to the first data bit 302C is not equal (condition 616) to 0 (e.g., greater than 0, less than 0). Further, for the variable node 404 corresponding to the first data bit 302C, signs of the first intrinsic likelihood $u_{01}$ and a hard decision likelihood $v_0$ are compared (operation 618) to determine whether the first data bit 302C is flipped. In accordance with a determination that the signs of the first intrinsic likelihood $u_{01}$ and a hard decision likelihood $v_0$ are opposite for the first data bit 302C, the data bit 302C corresponding to the variable node 404 is flipped (condition 620), e.g., from "1" to "0" or from "0" to "1."

Figure 8:
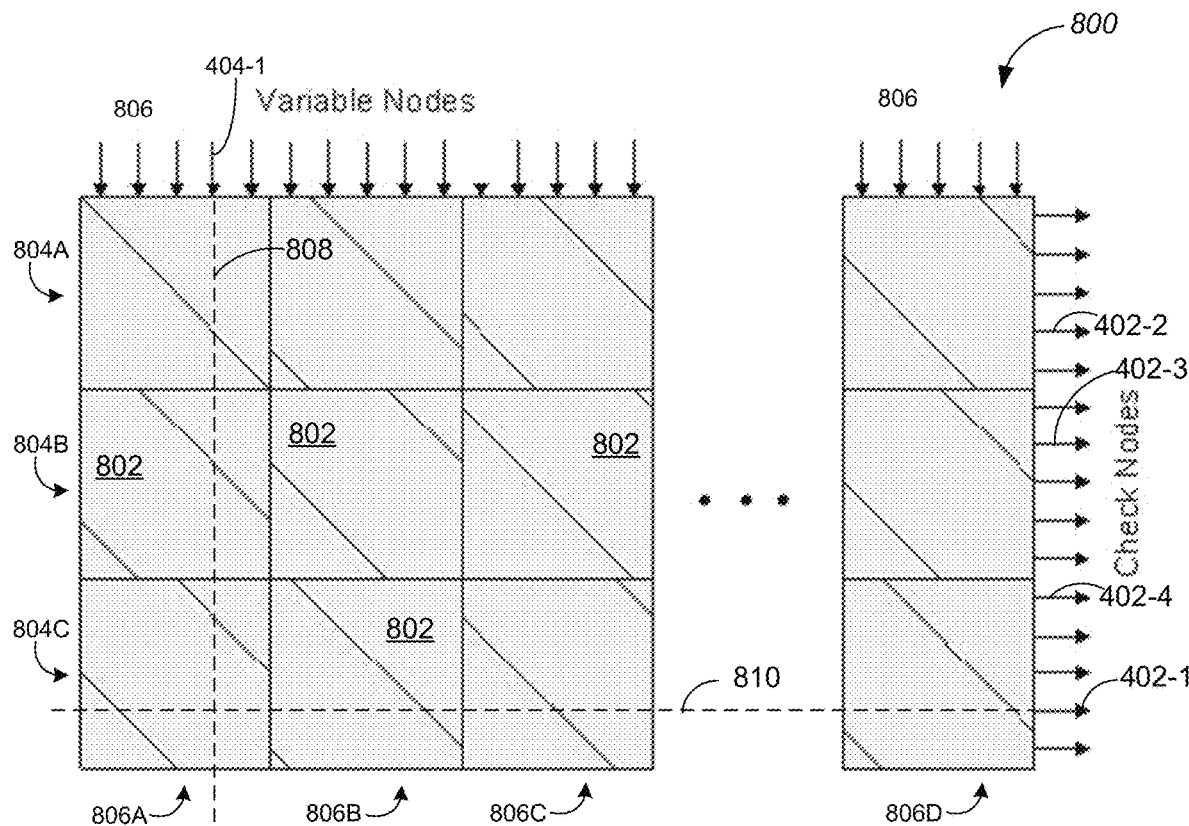
FIG. 8 illustrates an example parity-check matrix formed between variable nodes and check nodes of a codeword, in accordance with some embodiments.

The block of data of the codeword 302 corresponds to a plurality of check nodes 402 that are grouped into a plurality of check node groups. The check nodes 402 and variable nodes 404 are organized into an array of circulants 802 (FIG. 8). Each row of circulants corresponds to a respective check node group. For the first data bit 302C, the set of check nodes 402 associated with the variable node 404 is included (operation 622) in a subset of rows of circulants (e.g., corresponding to a subset of check node groups). In some situations, an error measure of at least a predefined number (e.g., one, two) of the subset of rows of circulants is compared (operation 624) with a threshold error measure. In accordance with a determination that the error measure of at least the predefined number (e.g., one, two) of the subset of rows of circulants is less than the threshold error measure, a high validity chance condition 626 is satisfied: otherwise, the high validity chance condition 626 is not satisfied. Based on the high validity chance condition 626 of each of the subset of rows of circulants, a column including the variable node 404 corresponding to the first data bit 302C is classified (operation 628) as "bad" or "not bad." In some situations, the column is determined (condition 630) as "not bad" if all of the subset of rows of circulants associated with the set of check nodes 402 have a relatively low error measure. More details on determining whether the column of circulants is "not bad" are explained below with reference to FIG. 8.

In some embodiments, conditions 616 and 620 are satisfied, and the adjustment factor s is applied and set to a non-zero value (e.g., -1, 1). Alternatively, in some embodiments, conditions 616, 620, and 630 are satisfied, and the adjustment factor s is applied and set to a non-zero value (e.g., -1, 1). Alternatively, in some embodiments, conditions 616, 620, 630, and 640 are satisfied, and the adjustment factor s is applied and set to a non-zero value (e.g., -1, 1). Specifically, in some situations, conditions 616, 620, 630, and 608 are satisfied. In some situations, conditions 616, 620, 630, and 612 are satisfied. In some situations, conditions 616, 620, 630, 608, and 612 are satisfied (642). In all above situations 642, the adjustment factor s is applied and set to a non-zero value (e.g., -1, 1). In some embodiments, the non-zero value of the adjustment factor is greater than 1 or smaller than -1, e.g., equal to 2.

Further, in some embodiments, when the adjustment factor s is applied (i.e., not equal to 0), a sign of the adjustment factor s is determined based on the sign of the intrinsic likelihood $u_0$ of the variable node 404. For example, the sign of the adjustment factor s is opposite to the sign of the intrinsic likelihood $u_0$ of the variable node 404. Stated another way, in accordance with a determination that the intrinsic likelihood $u_0$ is greater than 0, the adjustment factor s is equal to -1. In accordance with a determination that the intrinsic likelihood $u_0$ is not greater than 0 (i.e., equal to or less than 0), the adjustment factor s is equal to 1.

In some embodiments, a min-sum decoder operates on variable nodes 404 that represent codeword bits and check nodes 402 that represent parity-check equations. Messages are passed between variable nodes 404 and check nodes 402 in a series of iterations. When messages are received, a variable node update operation or a check node update operation is performed. These update operations are specified using equations. In some embodiments, equations associated with the variable node update are modified, e.g., by adding an adjustment factor s. When a variable node's bit value has flipped and the variable node can be classified as "not bad", the memory controller 202 makes it a little more difficult to flip by adding 1 in the direction of the flipped bit value. If the input LLR (also called an intrinsic likelihood $u_0$) is positive, the adjustment factor s is equal to -1: conversely, if the input LLR is negative, the adjustment factor s is equal to 1. This effectively reduces the input LLR value, but only temporarily for this iteration and not permanently. If the input LLR is 0, the codeword bit is erased, and the adjustment factor s is equal to 0.

In some embodiments, check nodes 402 are grouped. For example, each group includes 256 check nodes and corresponds to a row of circulants 804 corresponding to 256 check nodes. A number $N_e$ of unsatisfied check equations in each row 804 is determined for the check nodes in each row of circulants 804 (i.e., each check node group). The row 804 is classified as "bad" if the number $N_e$ of unsatisfied check equations is within 90% of a maximum number $N_M$ of unsatisfied check equations in a row 804 of circulants. For each variable node 404, if at least a predefined number (e.g., one, two) connected check node 402 does not belong to a "bad" row 804 of circulants and if the bit is not erased and has flipped, then the adjustment factor s is equal to 1 or -1, temporarily reducing the magnitude of the intrinsic likelihood $u_0$ for the data bit corresponding to the variable node 404 by 1 to make it harder to flip back.

In some embodiments, check node data and variable node data are determined during non-binary LDPC (NB-LDPC) decoding, which is based on with an extended min-sum (EMS) algorithm. The EMS algorithm operates on symbols (groups of bits) and has intrinsic likelihoods determined based on log-density ratios (LDRs) (e.g., not log-likelihood ratios (LLRs)). If the high validity condition is satisfied and the hard decision value is different from the input value, the variable node data is updated based on non-binary LDPC and the adjustment factor is temporarily adjusted slightly in favour of the new hard decision value. Specifically, for non-binary symbols (e.g., in an 8-element Galois field formed based on 3 bits), calculation for all 8 possible values is repeated for the corresponding variable node. A value is chosen out of 8 values, and has the highest log-density ratio to be the hard decision value for the 3 bits. A maximum operation is used. Alternatively, in some embodiments, a minimum operation is used if the LDRs are negated. An adjustment factor s is equal to 1 to the LDR associated with the new hard decision value.

Figure 7:
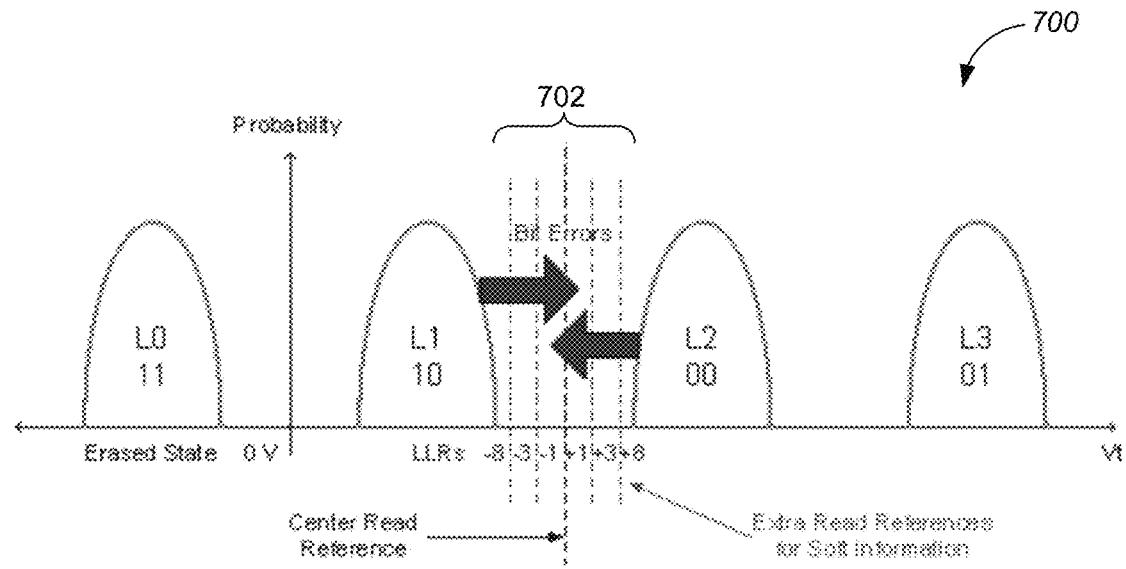
FIG. 7 illustrates an example soft bit read process, in accordance with some embodiments.

FIG. 7 illustrates an example soft bit read process 700, in accordance with some embodiments. In some embodiments, intrinsic LLR data (e.g., intrinsic likelihood $u_0$) corresponds to initial variable node data of each variable node 404 associated with a respective codeword bit of a codeword 302. The intrinsic LLR data is determined based on a log-likelihood ratio (LLR) that is approximated in equation (10). The intrinsic LLR data is determined based on data measured when a read reference voltage is adjusted for the memory system 200.

In some embodiments, the memory system 200 includes a multi-level cell (MLC) NAND flash memory chip, and each memory cell stores 2 data bits, which are optionally equal to one of four value combinations of "00," "01," "10," and "11." Every two successive value combinations (e.g., "10)" and "00") correspond to a threshold voltage configured to differentiate the two successive value combinations. For example, in accordance with a determination that an input read voltage is less than the threshold voltage, a first value combination L1 (e.g., "10") is extracted. Conversely, in accordance with a determination that the input read voltage is equal to or greater than the threshold voltage, a second value combination L2 (e.g., "00)") is extracted. In some situations, the threshold voltage is in the middle of voltage values corresponding to the first and second value combinations L1 and L2. Alternatively, in some situations, the threshold voltage deviates from the middle of voltage values corresponding to the first and second value combinations L1 and L2. During a soft bit read, multiple NAND reads are applied, such that the input read voltage is varied in a voltage range 702 including the threshold voltage. In some embodiments, as the input read voltage is varied during the multiple NAND reads, a current flowing through the MLC cell is measured to determine the threshold voltage between the value combinations L1 and L2, and each value combination result are represented as soft information (e.g., an integer approximation of the threshold voltage). The value combination results corresponding to the multiple NAND reads are further combined to determine an intrinsic likelihood $u_0$ of a variable node 404 corresponding to this memory cell.

In some embodiments, each of the two bits is read at a time. A read reference between L1 and L2 is applied to get the most significant bit of the levels. Two read references between L0-L1 and L2-L3 are applied to get the least significant bit of the levels. In an example, these bits across typically around 150,000 NAND memory cells, are read as the lower page and the upper page, respectively. Multiple read voltages are applied for each of the two bits during the soft bit read, and the intrinsic likelihood $u_0$ of a variable node 404 corresponding to this memory cell is determined based on data read from the memory cell as the multiple read voltages are successively applied to read pages of memory cells jointly.

FIG. 8 illustrates an example parity-check matrix 800 formed between variable nodes 404 and check nodes 402 of a codeword 302, in accordance with some embodiments. Data stored in memory channels 204 of the memory system 200 (FIG. 2) is grouped into coding blocks, and each coding block of data is called a codeword 302. Each codeword 302 further includes n data bits among which k data bits are user data 302D and (n-k) data bits are integrity data 302I of the user data 302D, where k and n are positive integers. An integrity check system 300 (FIG. 3) is configured to verify data integrity for each codeword 302 of the memory channels 204 using variable nodes 404 and check nodes 402. In some embodiments, the parity-check matrix 800 is applied to implement LDPC encoding and decoding methods.

The plurality of check nodes 402 is grouped into a plurality of circulants 802 (e.g., 3 rows and more than 4 columns of circulants in FIG. 8). Each row 804 of circulants 802 corresponds to a respective group of check nodes 402, and each column 806 of circulants 802 corresponds to a respective group of variable nodes 404. For example, based on the parity-check matrix 800, a vertical line 808 corresponding to a variable node 404-1 intersects with three rows 804A, 804B, and 804C of circulants 802, and a horizontal line 810 corresponding to a check node 402-1 intersects with at least four columns 806A, 806B, 806C, and 806D of circulants 802. In some embodiments, a memory controller 202 is configured to determine whether a column 806 is "bad" or "not bad." For each row 804 of circulants, a respective number $N_e$ of unsatisfied check nodes 402 (e.g., that fails integrity check or is not equal to "0") is identified to represent a number of errors that exist in the subset of variable nodes 404 that are connected to the subset of check nodes 402 represented by row 804 of circulants and indicate a difficulty level of correcting the errors. A maximum number $N_M$ of unsatisfied check nodes is identified for one of the rows 804 of circulants. In some embodiments, the respective number $N_e$ of unsatisfied check nodes 402 of the row 804 is greater than a product of a predefined scale factor and the maximum number $N_M$ of unsatisfied check nodes, e.g., 0.9 $N_M$, and the row 804 is determined as a "bad" row. In some embodiments, if less than 32% of all of the check nodes 402 are unsatisfied, the predefined scale factor is reduced, e.g., to 0.8, and a "bad" row 804 corresponds to a respective number $N_e$ of unsatisfied check nodes 402 of the row 804 greater than 0.8 $N_M$. In some embodiments, a row 804 is determined as a "bad" row, if the respective number $N_e$ of unsatisfied check nodes 402 of the row 804 is greater than a threshold number $N_{TH}$, which is smaller than the maximum number $N_M$ of unsatisfied check nodes by an offset value.

For each column of circulant, if every row where it has nonzero elements is "bad", then the column is classified as "bad". Otherwise, the column is "not bad". For example, based on the check node 404-1, the column 806A intersects with three rows 804A, 804B, and 804C of circulants 802. The column 806B is "bad" if all of the three rows 804A, 804B, and 804C are "bad," and "not bad" if any of the three rows 804A, 804B, and 804C is "not bad."

In some embodiments, the set of check nodes associated with the variable node 404 (e.g., 404-1) is included in a subset of rows 804 of the circulants 802. For example, based on the parity-check matrix 800, the variable node 404-1 corresponds to a set of check nodes 402, including check node 402-2 in the row 804, check node 402-3 in the row 804C, and check node 402-4 in the row 804E. Under some circumstances, a high validity chance condition 626 (FIG. 6) is satisfied in accordance with a determination that an error measure of at least a predefined number (e.g., one, two) of the subset of rows 804 of the circulants is less than a threshold error measure. As explained above, the error measure of each row 804 includes a respective number $N_e$ of unsatisfied check nodes 402, and the threshold error measure is a product of a predefined scale factor (e.g., 0.8, 0.9) and a maximum number $N_M$ of unsatisfied check nodes among all of the rows 804. When the high validity chance condition is satisfied, the column corresponding to the variable node 404 (e.g., 404-1) is "not bad."

Further, in some embodiments, in accordance with a determination that the high validity chance condition 626 is satisfied, the adjustment factor s is determined based on the hard decision likelihood. Stated another way, the adjustment factor s is determined based on the hard decision likelihood $v_0$, in accordance with a determination that an error measure of at least a predefined number (e.g., one, two) of the subset of rows of circulants is less than a threshold error measure. For example, the adjustment factor s is determined based on whether the hard decision likelihood $v_0$ has a sign opposite to that of the intrinsic likelihood $u_0$. Further, in some embodiments, a first row of check mode circulants has a first error measure that is greater than or equal to any remaining rows of circulants. The threshold error measure is determined as a product of the first error measure and a predefined scale factor (e.g., 0.8, 0.9). For example, the first error measure is the maximum number $N_M$ of unsatisfied check nodes among all of the rows 804.

Figure 9:
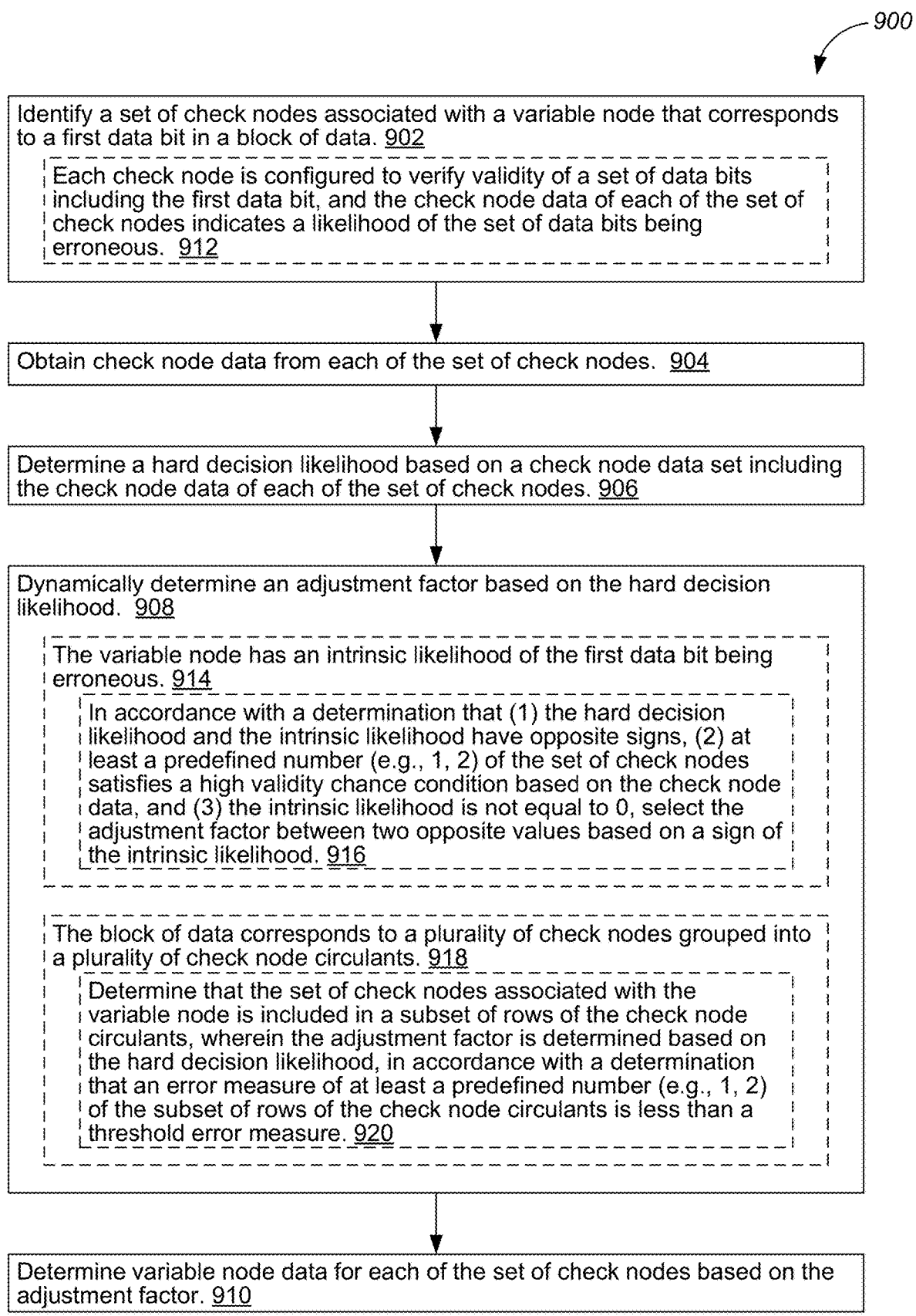
FIG. 9 is a flow diagram of an example method for managing variable node data (e.g., a variable-to-check node message) for data validation in an electronic device, in accordance with some embodiments.

FIG. 9 is a flow diagram of an example method 900 for managing variable node data (e.g., a variable-to-check node message $v_m$) for data validation in an electronic device, in accordance with some embodiments. The method 900 is implemented at an electronic device including a memory system 200 (FIG. 2). The electronic device identifies (operation 902) a set of check nodes 402 (FIG. 4C) associated with a variable node 404 that corresponds to a first data bit 302C in a block of data, and obtains (operation 904) check node data from each of the set of check nodes 402. A hard decision likelihood $v_0$ is determined (operation 906) based on a check node data set including the check node data of each of the set of check nodes 402. The electronic device dynamically determines (operation 908) an adjustment factor s based on the hard decision likelihood $v_0$, and determines (operation 910) variable node data for each of the set of check nodes 402 based on the adjustment factor s.

In some embodiments, each check node 402 is configured (operation 912) to verify validity of a set of data bits including the first data bit 302C, and the check node data of each of the set of check nodes 402 indicates a likelihood of the set of data bits being erroneous. All of the set of check nodes 402 all correspond to the first data bit 302C.

In some embodiments, the variable node 302C has (operation 914) an intrinsic likelihood $u_0$ of the first data bit 302C (e.g., being a logical bit 0, a logical bit 1, or erroneous). The adjustment factor s is determined (operation 916) based on the hard decision likelihood $v_0$ by selecting the adjustment factor s between two opposite values based on a sign of the intrinsic likelihood $u_0$ in accordance with a determination that (1) the hard decision likelihood $v_0$ and the intrinsic likelihood $u_0$ have opposite signs, (2) at least one of the set of check nodes 402 satisfies a high validity chance condition based on the check node data, and (3) the intrinsic likelihood $u_0$ is not equal to 0. Further, in some embodiments, the adjustment factor s between two opposite values is selected by determining a sign of the adjustment factor s to be opposite to the sign of the intrinsic likelihood $u_0$. In some embodiments, the adjustment factor s is determined based on the hard decision likelihood $v_0$ by determining that the absolute value of the intrinsic likelihood $u_0$ is less than a threshold intrinsic likelihood $u_0$. In some embodiments the threshold intrinsic likelihood $u_0$ is equal to a half of an average of intrinsic likelihoods $u_0$ of the block of data.

In some embodiments associated with a hard bit read, there is no soft information in the input codeword. Each data bit has either a positive intrinsic likelihood $u_0$ or a negative intrinsic likelihood $u_0$ with the same absolute value. Otherwise, the respective bit is erased, and there is an intrinsic likelihood $u_0$ equal to zero. In that case, the threshold intrinsic likelihood $u_0$ is equal to any number greater than the positive intrinsic likelihood $u_0$, which includes every data bit that has a nonzero intrinsic likelihood $u_0$.

Further, in some embodiments, the block of data corresponds (operation 918) to a plurality of check nodes 402 grouped into a plurality of circulants (FIG. 8). The electronic device determines (operation 920) that the set of check nodes 402 associated with the variable node 404 is included in a subset of rows 804 of the circulants. The electronic device determines that the high validity chance condition is satisfied in accordance with a determination that an error measure of at least one of the subset of rows 804 of circulants is less than a threshold error measure.

In some embodiments, the variable node 302C has an intrinsic likelihood $u_0$ of the first data bit 302C (e.g., being a logical bit 0, a logical bit 1, or erroneous), and the adjustment factor s is determined based on the hard decision likelihood $v_0$, in accordance with a determination that (1) the hard decision likelihood $v_0$ and the intrinsic likelihood $u_0$ have the same sign, (2) at least a number (e.g., each and every one) of the set of check nodes 402 does not satisfy a high validity chance condition based on the check node data, or (3) the intrinsic likelihood $u_0$ is equal to 0, resetting the adjustment factor s to 0.

In some embodiments, the adjustment factor s is determined based on both the hard decision likelihood $v_0$ and an intrinsic likelihood $u_0$ of the first data bit 302C (e.g., being a logical bit 0, a logical bit 1, or erroneous). Further, in some embodiments, the adjustment factor s is determined based on both the hard decision likelihood $v_0$ and the intrinsic likelihood $u_0$ of the first data bit 302C, in accordance with a determination that the intrinsic likelihood $u_0$ is not equal to 0.

In some embodiments, the block of data corresponds to a plurality of check nodes 402 grouped into a plurality of circulants (FIG. 8). The electronic device determines that the set of check nodes 402 associated with the variable node 404 is included in a subset of rows 804 of circulants. The adjustment factor s is determined based on the hard decision likelihood $v_0$, in accordance with a determination that an error measure of at least one of the subset of rows 804 of circulants is less than a threshold error measure. Further, in some embodiments, the electronic device determines a first row of check node circulants having a first error measure that is greater than or equal to any remaining check node circulant rows 804, and determines the threshold error measure, e.g., as a product of the first error measure and a predefined scale factor. For example, the predefined scale factor is equal to 0.8 or 0.9. Alternatively, in some embodiments, the threshold error measure is less than the first error measure by an offset value.

In some embodiments, the adjustment factor s is determined based on the hard decision likelihood $v_0$ by determining whether the hard decision likelihood $v_0$ and an intrinsic likelihood $u_0$ of the first data bit 302C have opposite signs: in accordance with a determination that the hard decision likelihood $v_0$ and the intrinsic likelihood $u_0$ have opposite signs, selecting the adjustment factor s between two opposite values based on a sign of the intrinsic likelihood $u_0$; and in accordance with a determination that the hard decision likelihood $v_0$ and the intrinsic likelihood $u_0$ have the same sign, setting the adjustment factor s to 0. Further, in some embodiments, the electronic device determines that the intrinsic likelihood $u_0$ is not equal to 0. In accordance with a determination that the hard decision likelihood $v_0$ and the intrinsic likelihood $u_0$ have opposite signs and that the intrinsic likelihood $u_0$ is not equal to 0, a sign of the adjustment factor s is determined to be opposite to a sign of the intrinsic likelihood $u_0$. Additionally, in some embodiments, the electronic device determines whether each of the set of check nodes 402 satisfies a high validity chance condition based on the check node data, and selects the adjustment factor s between the two opposite values by determining a sign of the adjustment factor s to be opposite to a sign of the intrinsic likelihood $u_0$ in accordance with a determination that the hard decision likelihood $v_0$ and the intrinsic likelihood $u_0$ have opposite signs and that all of the set of check nodes 402 satisfies the high validity chance condition.

In some embodiments, the adjustment factor s is determined by selecting the adjustment factor s from a group consisting of −1, 1, and 0. In some embodiments, the adjustment factor s is determined to have a magnitude greater than 1.

In some embodiments, the hard decision likelihood $v_0$ is a linear combination of the check node data of all of the set of check nodes 402 and an intrinsic likelihood $u_0$ of the first data bit 302C. Further, in some embodiments, the electronic device reads a plurality of bit values of the first data bit 302C using a plurality of read voltage levels and determines the intrinsic likelihood $u_0$ of the first data bit 302C based on the plurality of bit values. Further, in some embodiments, the intrinsic likelihood $u_0$ of the first data bit 302C is approximated with a log-likelihood ratio (LLR) that is represented as follows:

$$LLR(y) = \ln \frac{p(x=0|y)}{p(x=1|y)} = \ln \frac{p(y|x=0)}{p(y|x=1)}$$

where p(|) is a probability of a combination of data values, x is a value stored for the first data bit 302C, and y is a real value of the first data bit 302C.

In some embodiments, the electronic device determines whether each of the set of check nodes 402 satisfies a high validity chance condition based on the check node data. In accordance with a determination that at least a number (e.g., each and every one) of the set of check nodes 402 does not satisfy the high validity chance condition, the adjustment factor s is reset to 0.

In various embodiments of this application, a variable node data equation is updated to include an adjustment factor s, e.g., in equation (9), thereby adjusting an intrinsic likelihood $u_0$.

Memory is also used to store instructions and data associated with the method 2000, and includes high-speed random-access memory, such as SRAM, DDR DRAM, or other random access solid state memory devices: and, optionally, includes non-volatile memory, such as one or more magnetic disk storage devices, one or more optical disk storage devices, one or more flash memory devices, or one or more other non-volatile solid state storage devices. The memory, optionally, includes one or more storage devices remotely located from one or more processing units. Memory, or alternatively the non-volatile memory within memory, includes a non-transitory computer readable storage medium. In some embodiments, memory, or the non-transitory computer readable storage medium of memory, stores the programs, modules, and data structures, or a subset or superset for implementing method 900. Alternatively, in some embodiments, the electronic device implements the method 900 at least partially based on an ASIC. The memory system 200 of the electronic device includes an SSD in a data center or a client device.

Each of the above identified elements may be stored in one or more of the previously mentioned memory devices, and corresponds to a set of instructions for performing a function described above. The above identified modules or programs (i.e., sets of instructions) need not be implemented as separate software programs, procedures, modules or data structures, and thus various subsets of these modules may be combined or otherwise re-arranged in various embodiments. In some embodiments, the memory, optionally, stores a subset of the modules and data structures identified above. Furthermore, the memory, optionally, stores additional modules and data structures not described above.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

What is claimed is:

1. A method implemented at an electronic device for data validation, comprising:
    extracting a block of data from memory channels of a memory device;
    identifying a set of check nodes associated with a variable node that corresponds to a first data bit in the block of data;
    extracting, from a register, check node data of each of the set of check nodes;
    determining a hard decision likelihood of the variable node based on a combination of the check node data of the set of check nodes;
    dynamically determining an adjustment factor for the variable node based on the hard decision likelihood of the variable node;
    determining variable node data for the variable node associated with the set of check nodes based on the adjustment factor; and
    validating the block of data including the first data bit based on the variable node data.

2. The method of claim 1, wherein each check node is configured to verify validity of a set of data bits including the first data bit, and the check node data of each of the set of check nodes indicates a likelihood of the set of data bits being erroneous.

3. The method of claim 1, wherein the variable node has an intrinsic likelihood of the first data bit, determining the adjustment factor based on the hard decision likelihood further comprising:
in accordance with a determination that (1) the hard decision likelihood and the intrinsic likelihood have opposite signs, (2) each of the set of check nodes satisfies a high validity chance condition based on the check node data, and (3) the intrinsic likelihood is not equal to 0, selecting the adjustment factor between two opposite values based on a sign of the intrinsic likelihood.

4. The method of claim 3, wherein selecting the adjustment factor between two opposite values further includes determining a sign of the adjustment factor to be opposite to the sign of the intrinsic likelihood.

5. The method of claim 3, determining the adjustment factor based on the hard decision likelihood further comprising:
determining that the absolute value of the intrinsic likelihood is less than a threshold intrinsic likelihood.

6. The method of claim 3, wherein the block of data corresponds to a plurality of check nodes grouped into a plurality of circulants, the method further comprising:
determining that the set of check nodes associated with the variable node is included in a subset of rows of circulants; and
determining that the high validity chance condition is satisfied in accordance with a determination that an error measure of at least one of the subset of rows of the circulants is less than a threshold error measure.

7. The method of claim 1, wherein the variable node has an intrinsic likelihood of the first data bit, determining the adjustment factor based on the hard decision likelihood further comprising:
in accordance with a determination that (1) the hard decision likelihood and the intrinsic likelihood have the same sign, (2) each and every one of the set of check nodes does not satisfy a high validity chance condition based on the check node data, or (3) the intrinsic likelihood is equal to 0, resetting the adjustment factor to 0.

8. The method of claim 1, wherein the adjustment factor is determined based on both the hard decision likelihood and an intrinsic likelihood of the first data bit.

9. The method of claim 1, wherein the adjustment factor is determined based on both the hard decision likelihood and an intrinsic likelihood of the first data bit, in accordance with a determination that the intrinsic likelihood is not equal to 0.

10. The method of claim 1, wherein the block of data corresponds to a plurality of check nodes grouped into a plurality of circulants, the method further comprising:
determining that the set of check nodes associated with the variable node is included in a subset of rows of circulants, wherein the adjustment factor is determined based on the hard decision likelihood, in accordance with a determination that an error measure of at least one of the subset of rows of circulants is less than a threshold error measure.

11. The method of claim 10, further comprising:
determining a first row of circulants having a first error measure that is greater than or equal to any remaining rows of circulants; and
determining the threshold error measure as a product of the first error measure and a predefined scale factor.

12. A non-transitory computer-readable storage medium storing one or more programs to be executed by one or more processors, the one or more programs comprising instructions for:
extracting a block of data from memory channels of a memory device;
identifying a set of check nodes associated with a variable node that corresponds to a first data bit in the block of data;
extracting, from a register, check node data of each of the set of check nodes;
determining a hard decision likelihood of the variable node based on a combination of the check node data of each of the set of check nodes;
dynamically determining an adjustment factor for the variable node based on the hard decision likelihood of the variable node;
determining variable node data for the variable node associated with the set of check nodes based on the adjustment factor; and
validating the block of data including the first data bit based on the variable node data.

13. The non-transitory computer-readable storage medium of claim 12, determining the adjustment factor based on the hard decision likelihood further comprising:
determining whether the hard decision likelihood and an intrinsic likelihood of the first data bit have opposite signs;
in accordance with a determination that the hard decision likelihood and the intrinsic likelihood have opposite signs, selecting the adjustment factor between two opposite values based on a sign of the intrinsic likelihood; and
in accordance with a determination that the hard decision likelihood and the intrinsic likelihood have the same sign, setting the adjustment factor to 0.

14. The non-transitory computer-readable storage medium of claim 13, the one or more programs further comprising instructions for:
determining that the intrinsic likelihood is not equal to 0;
selecting the adjustment factor between the two opposite values further includes in accordance with a determination that the hard decision likelihood and the intrinsic likelihood have opposite signs and that the intrinsic likelihood is not equal to 0, determining a sign of the adjustment factor to be opposite to a sign of the intrinsic likelihood.

15. The non-transitory computer-readable storage medium of claim 13, the one or more programs further comprising instructions for:
determining whether each of the set of check nodes satisfies a high validity chance condition based on the check node data;
selecting the adjustment factor between the two opposite values further includes in accordance with a determination that the hard decision likelihood and the intrinsic likelihood have opposite signs and that all of the set of check nodes satisfies the high validity chance condition, determining a sign of the adjustment factor to be opposite to a sign of the intrinsic likelihood.

16. An electronic device, comprising:
one or more processors; and
memory storing one or more programs to be executed by the one or more processors, the one or more programs comprising instructions for:
extracting a block of data from memory channels of a memory device;

identifying a set of check nodes associated with a variable node that corresponds to a first data bit in the block of data;

extracting, from a register, check node data of each of the set of check nodes;

determining a hard decision likelihood of the variable node based on a combination of the check node data of the set of check nodes;

dynamically determining an adjustment factor for the variable node based on the hard decision likelihood of the variable node;

determining variable node data for the variable node associated with the set of check nodes based on the adjustment factor; and validating the block of data including the first data bit based on the variable node data.

17. The electronic device of claim 16, wherein determining the adjustment factor further includes selecting the adjustment factor from a group consisting of −1, 1, and 0.

18. The electronic device of claim 16, wherein the hard decision likelihood is a linear combination of the check node data of all of the set of check nodes and an intrinsic likelihood of the first data bit.

19. The electronic device of claim 18, the one or more programs further comprising instructions for:

reading a plurality of bit values of the first data bit using a plurality of read voltage levels; and determining the intrinsic likelihood of the first data bit based on the plurality of bit values.

20. The electronic device of claim 16, the one or more programs further comprising instructions for:

determining whether each of the set of check nodes satisfies a high validity chance condition based on the check node data; and in accordance with a determination that each and every one of the set of check nodes does not satisfy the high validity chance condition, resetting the adjustment factor to 0.

* * * * *